United States Patent [19]

Wada et al.

[11] Patent Number: 4,790,902

[45] Date of Patent: Dec. 13, 1988

[54] METHOD OF PRODUCING CONDUCTOR CIRCUIT BOARDS

[75] Inventors: Tatsuo Wada, Ebina; Keizo Yamashita, Shizuoka; Tasuku Touyama, Shimizu; Teruaki Yamamoto, Shizuoka, all of Japan

[73] Assignee: Meiko Electronics Co., Ltd., Ayase, Japan

[21] Appl. No.: 131,050

[22] PCT Filed: Feb. 21, 1987

[86] PCT No.: PCT/JP87/00111

§ 371 Date: Oct. 16, 1987

§ 102(e) Date: Oct. 16, 1987

[87] PCT Pub. No.: WO87/05182

PCT Pub. Date: Aug. 27, 1987

[30] Foreign Application Priority Data

Feb. 21, 1986 [JP] Japan ................ 61-036712

[51] Int. Cl.[4] ........................ B44C 1/22; C03C 15/00; C03C 25/06; C23F 1/00
[52] U.S. Cl. ........................ 156/630; 29/848; 156/151; 156/153; 156/233; 156/236; 156/240; 156/249; 156/631; 156/634; 156/645; 156/650; 156/656; 156/659.1; 156/902; 156/666; 204/15; 204/23; 204/32.1
[58] Field of Search ............... 156/150, 151, 153, 154, 156/233, 235, 236, 240, 241, 247, 249, 629, 630, 631, 634, 645, 650, 656, 659.1, 664, 666, 901, 902; 174/68.5; 427/96–98; 428/601, 901; 29/846, 848–852, 856; 204/15, 23, 32.1, 34, 40, 44, 52.1

[56] References Cited

U.S. PATENT DOCUMENTS

| 4,604,160 | 8/1986 | Murakami et al. ............ 156/630 |
| 4,606,787 | 8/1986 | Pelligrino .................. 156/150 X |
| 4,715,116 | 12/1987 | Thorpe et al. ................ 29/846 |

FOREIGN PATENT DOCUMENTS

| 51-39539 | 4/1976 | Japan . |
| 55-32239 | 8/1980 | Japan . |
| 0147192 | 3/1985 | Japan . |

Primary Examiner—William A. Powell
Attorney, Agent, or Firm—Frishauf, Holtz, Goodman & Woodward

[57] ABSTRACT

A thin metal layer with a thickness of 1 to 5 $\mu$ is formed electrolytically (S2) on an electrically conductive single-plate substrate having a predetermined roughness, a resist mask is formed (S3) on the surface of the thin metal layer, and a conductor circuit is then electroformed thereon (S4) using copper. After the surface of the conductor circuit is roughened (S5), the conductor circuit, along with the single plate and the interposed thin metal layer, is stacked on an insulating substrate for lamination, and the individual layers are adhered integrally to one another by the application of heat and pressure (S7). Then, the single plate only is peeled off (S8), and the exposed thin metal layer is removed by etching (S9). The thin metal layer and the conductor circuit are electroplated under high-speed conditions including a solution contact speed of 2.6 to 20 m/sec and a current density of 0.15 to 4.0 A/cm$^2$, so that a required adhesion force can be obtained between the thin metal layer and the resist mask, and the conductor circuit can be made as flexible as rolled annealed copper. Thus, very thin, high-density conductor circuits can be produced which, having a thickness of 10 $\mu$m or less, are adapted not only for rigid printed wiring boards but also for flexible printed wiring boards.

8 Claims, 12 Drawing Sheets

METHOD OF PRODUCING CONDUCTOR CIRCUIT BOARDS

TECHNICAL FIELD

The present invention relates to a method of producing conductor circuit boards adapted to be incorporated in IC cards, electronic equipment, etc.

BACKGROUND ART

With the recent development of lighter or thinner, higher-performance versions of IC cards, electronic devices, etc., circuit patterns of conductor circuit boards incorporated therein tend to become still higher in density and less in thickness. Accordingly, there is a demand for a method for efficiently mass-producing such conductor circuit boards of high quality.

As a conventional method of producing conductor circuit boards, there is the so-called etching method in which a copper foil with a thickness of 18 μm to 35 μm or more is bonded to the surface of an insulating substrate, made of e.g. glass-epoxy resin, for lamination, the surface of the copper foil is masked with use of a resist, such as a photoresist, printing resist, etc., and undesired portions of the foil surface except conductor circuits are removed by etching.

According to this method, however, it is economically difficult to reduce the thickness of the copper foil of the copper-clad substrate on account of problems on processes of production. Essentially, therefore, this method is unfit for the production of thin-film versions of conductor circuit boards. It is necessary, moreover, to use a copper foil with a thickness of 18 μm or more in order to fully stand a tensile force, bending force, etc., which are physically applied during processes after the production of the copper foil, including surface treatment, cutting, and lamination on the insulating substrate. It is therefore difficult to obtain a copper-clad substrate with a copper-foil thickness of 5 to 10μ which are required for the production of higher-density versions of conductor circuits.

As means for settling these problems of the etching method, conductor circuit boards are conventionally known which are manufactured by the so-called transfer method. Examples of such conductor circuit boards are disclosed in Japanese Patent Publication No. 55-32239 (U.S. Pat. No. 4,053,370), Japanese Patent Publication No. 57-24080, Japanese Patent Publication No. 57-39318, Japanese Provisional Patent Publication No. 60-147192, etc.

In a method (hereinafter referred to as belt transfer method) of producing conductor circuit boards disclosed in Japanese Patent Publication No. 55-32239 (U.S. Pat. No. 4,053,370), Japanese Patent Publication No. 57-24080, and Japanese Patent Publication No. 57-39318, a conductor circuit board is produced in the following manner. A resist mask is applied to the surface of a thin, electrically conductive metal belt which slides on the outer peripheral surface of a metallic rotating drum or a cathode portion of a horizontal plating apparatus. The metal belt, for use as a cathode, is transported while being kept at a predetermined distance from an insoluble anode. A plating solution is supplied compulsorily between the metal belt and the anode at high speed, thereby electrolytically forming a conductor circuit on the surface of the metal belt. After an insulating substrate, having a bonding agent previously applied thereto, is adhered to the conductor circuit, the insulating substrate and the conductor circuit are peeled from the metal belt, and the conductor circuit is coated with an overlay for lamination, as required. Thus, the conductor circuit board is completed. Adapted for high-speed plating, the belt transfer method has the advantage over the conventional etching method that it permits very fast formation of the conductor circuit and continuous production of the conductor circuit boards. However, the belt transfer method is subject to the following drawbacks. During a peeling step in which the insulating substrate, having the conductor circuit transferred thereto, is peeled from the metal belt, part of the conductor circuit may not be able to be transferred to the insulating substrate, due to the difference between the strength of adhesion between the conductor circuit and the metal surface and that between the resist and the metal belt surface, and other causes. For the same reason, moreover, the material of the resist mask may be transferred to the insulating substrate, or the circuit may swing or be deformed during the transfer and peeling steps, thereby causing such defects as a short circuit, wrinkling, breakage, bruises, cracks, etc.

Using the metal belt as the electrically conductive substrate, moreover, the belt transfer method has a defect such that the metal belt, if having a substantial width, undulates as its travels, so that it is difficult to maintain a fixed distance between the metal belt and the anode. Therefore, the thickness of the conductor circuit, which is electrolyzed on the metal belt, varies according to location. If the conductor circuit has a fine circuit pattern, it is poor in dimensional stability during the transfer step and in yield. Thus, the belt transfer method does not permit the use of a wide metal belt, and can be improved only limitedly in productivity.

In the so-called reel-to-reel system disclosed in Japanese Patent Publication No. 57-24080, for example, a metal belt of stainless steel on a reel is wound therefrom by means of another reel. With this arrangement, the surface of the stainless-steel plate may suffer flaws, soiling, or other damages, and a resist pattern is liable to be soiled or flawed when it is applied. If work is suspended to remove soil or flaws on the pattern, the formation of the circuit, in its turn, is spoiled. Thus, according to the reel-to-reel system, the work (line) cannot readily be suspended even when the resist pattern suffers soiling, flaws, or other damages. This results in an increase in fraction defective, reduction in working efficiency, etc.

If stainless steel is used for the metal belt, moreover, inevitable physical or electrochemical defects, such as pores, exist on the surface of the metal belt. According to the belt transfer method, the conductor circuit is electrolytically precipitated in a direct manner on the surface of the metal belt with such defects, and is therefore liable to suffer pinholes. Such a situation is particularly important to high-density conductor circuit boards with a copper circuit width of 100 μm or less and a circuit interval of 100 μm or less.

Furthermore, FIG. 22 is a sectional view showing a step of overlay lamination based on the belt transfer method. A conductor circuit 92 bonded to an insulating substrate 91 by the belt transfer method projects above the surface of the substrate 91. Therefore, an overlay film 93 cannot be fully adhered to the outer peripheral surface of the conductor circuit 92 from over the same. Accordingly, air layers (voids) 94 are produced between the overlay film 93 and the conductor circuit 92.

If the air layers 94 exist, the conductor circuit 92 is exposed to and oxidized by high-temperature air when it is heated in the overlay lamination step. It is difficult to entirely remove these air layers (voids) 94 by the prior art method, and this constitutes a primary factor in an increase of manufacturing cost. Further, the presence of the air layers 94 causes the conductor circuit 92 to be oxidized with the passage of time, as well as by the heating in the overlay lamination step. In the overlay lamination step, moreover, the insulating substrate 91, the conductor circuit 92, and the overlay film 93 are held between upper and lower rolls 95, 95, as shown in FIG. 22, when they are pressure-bonded with heat. According to the belt transfer method, however, the circuit 92 is adhered to the insulating substrate 91 so as to projects above the substrate 91, as mentioned before. As it is pressed by the rollers 95, therefore, the conductor circuit 92 is dislocated (swung) in the directions of the arrows of FIG. 22, with respect to the insulating substrate 91. Thus, the dimensional stability is poor.

A method (hereinafter referred to as conventional transfer method) of producing conductor circuit boards disclosed in Japanese Provisional Patent Publication No. 60-147192, mentioned before, comprises a step (FIG. 23(a)) of forming a thin metal layer on a metal substrate, a step (FIG. 23(b)) of roughening the surface of the thin metal layer, a step (FIG. 23(c)) of forming a plating resist on the whole surface of the thin metal layer except that portion thereof which is to be formed with a conductor circuit, a step (FIG. 23(d)) of forming the conductor circuit by plating the surface of the thin metal layer formed with the plating resist, a step (FIG. 23(e)) of peeling the thin metal layer, the conductor circuit, and the plating resist together from the substrate and transferring them to an insulating substrate, a step (FIG. 23(f)) of peeling off the metal substrate, and a step (FIG. 23(g)) of removing the transferred thin metal layer by etching. This conventional transfer method has the advantage over the aforementioned belt transfer method in that the conductor circuit can be transferred easily and securely in the following manner. A thin metal layer of about 1 to 10 μm is previously formed on the substrate, and the resulting structure, along with the plating resist and the conductor circuit, is transferred to the insulating substrate. The surface of the thin metal layer is roughened by chemical etching, using a mixed solution of cupric chloride and hydrochloric acid. By doing this, good adhesion of the resist and the conductor circuit plating film to the thin metal layer can be maintained. However, the conventional transfer method indispensably requires the step of roughening the surface of the thin metal layer after forming the thin metal layer on the substrate in the aforesaid manner. This roughening process takes much time, thus exerting a bad influence on the improvement of productivity, and constituting a hindrance to the simplification of manufacturing processes.

In order to improve the adhesion between the conductor circuits and the insulating substrate, on the other hand, the surfaces of the conductor circuits must have a predetermined roughness.

DISCLOSURE OF THE INVENTION

The object of the present invention is to provide a method of producing conductor circuit boards, which is high in productivity and permits minimized equipment and installation space therefor, and whereby a high-density circuit pattern can be formed securely and with stability.

In order to achieve the above object, the inventors hereof conducted various researches, and obtaining the following findings. The so-called high-speed plating method is needed to attain high productivity with use of minor production equipment and a narrow installation space. Electrolytic plating conditions for the high-speed plating method were able to be determined which provide a plated surface of a required roughness without requiring a special surface-roughening process. Conductor circuits can be transferred easily and securely to an insulating substrate as follows. First, the conductor circuits are formed on a single-plate conductive substrate with the interposition of a thin metal layer by the so-called single-plate pressing. Then, the conductor circuits, along with the thin metal layer and the single plate, are transferred to the insulating substrate for lamination. Thereafter, the single plate and the thin metal layer are removed.

More specifically, in a method of producing conductor circuit boards according to the present invention, a planar, electrically conductive substrate with a surface roughness of 0.08 to 0.23, for use as a cathode, and a planar anode are spaced at an interelectrode distance of 3 to 30 mm from each other. An electrolytic solution is compulsorily supplied to these electrodes so that the electrolytic solution comes into contact with the electrodes at a solution contact speed of 2.6 to 20.0 m/sec, thereby electroplating the electrodes under the condition of a current density of 0.15 to 4.0 A/cm$^2$. Thus, a thin metal layer with a thickness of 1 to 5 μm is formed on the conductive substrate. A resist mask is formed on the whole surface of the formed thin metal layer except that portion thereof which is to be formed with a conductor circuit. The conductor circuit is formed by electroplating the surface of the thin metal layer, with the resist mask thereon, under the same conditions as the aforesaid electroplating conditions, using the electrolytic solution containing copper ions. The surface of the formed conductor circuit is roughened, and an insulating substrate and the conductive substrate are laminated and pressure-bonded together, with thus formed conductor circuit therebetween, with use of heat. After the conductive substrate only is peeled off, the thin metal layer is removed by etching. Thus, the conductor circuit is completed.

The following four points are advantages which can be claimed for the use of the above described thin metal layer between the single-plate conductive substrate and the conductor circuit.

(1) The single plate with the conductor circuit, with the thin metal layer between them, is superposed on the insulating substrate, and the resulting structure is pressurized and heated for a predetermined period of time by means of a press. After the structure solidifies as a laminate, the single plate and the thin metal layer can be separated from each other with a peeling strength of 70 to 120 g/cm. Thus, transfer lamination can be accomplished easily without entailing change of dimensions or defective appearance.

(2) In the manufacture of a double-sided multilayer substrate, through-hole plating is needed to secure conduction between two opposite sides. If the thin metal layer of the present invention is not interposed in the through-hole plating process, the through-hole plating may be effected by methods (a) or (b) as follows. In the method (a), a through-hole plating film is deposited to a required thickness by electroless plating. In the method (b), the required film thickness is obtained by effecting electroplating after depositing a film with a thickness of about 0.3 to 0.5 μm by electroless plating. The method (a), in which an electroless plating film with a thickness of about 25 μm is deposited in a through hole solely by electroless plating, requires a plating time of several hours to 10 hours, thus lowering the productivity. Moreover, the crystalline grain of the deposited film is coarse, and the thermal resistance is low in reliability. According to the method (b), in which the required film thickness is obtained by electroplating with copper after electroless plating, it is difficult to allow a through hole portion to conduct electrically for electrolysis, in through-hole plating an electrically independent insular circuit on a substrate circuit. The thin metal layer of the present invention allows the independent circuit to conduct electrically, thereby permitting electroplating using copper.

(3) Even after the surface of the single-plate conductive substrate (e.g., stainless steel) is fully polished chemically and physically, ingredients in the substrate may slip off due to nonmetallic inclusions in the substrate or electrochemical defects thereof, or intermetallic compounds, segregations, pores, etc., may remain on the substrate surface. These defects cannot be fully offset in an economical manner. The thin metal layer of the present invention can offset these defects of the substrate, so that pinholes cannot be produced. Thus, a circuit substrate having a fine pattern with a width of 100 μm or less can be manufactured easily and at low cost.

(4) After the thin metal layer and the copper circuit are formed on the single-plate conductive substrate, the resulting structure is transferred to the insulating substrate for lamination in a step of pressure bonding with heat. In doing this, a B-stage bonding agent of resin applied to or impregnated into the insulating substrate melts and is urged to flow out to the peripheral surface of the single-plate conductive substrate during the processes of its gelling and solidifcation. Since the thin metal layer is extended to the peripheral portion of the single-plate conductive substrate so as to cover its surface entirely, however, the overflown solidified resin remains on the surface of the thin metal layer. In the steps of transfer lamination and separation, therefore, the single-plate conductive substrate can be easily separated from the boundary (interface) between itself and the thin metal layer. Thus, the bonding agent can never adhere or stick to the single-plate conductive substrate.

BEST MODE OF CARRYING OUT THE INVENTION

Figure 1:
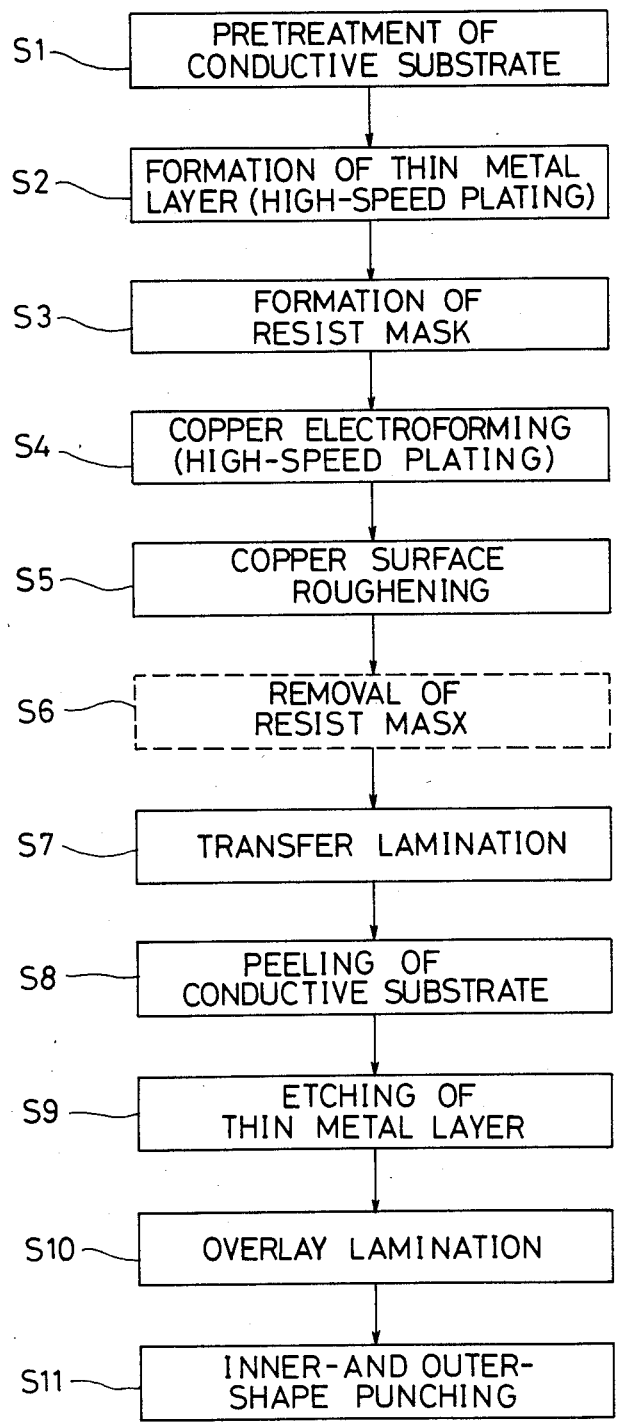
FIG. 1 is a process flow chart for illustrating manufacturing steps of a method of producing a conductor circuit board according to the present invention.

Referring now to FIGS. 1 to 9, steps of manufacturing a conductor circuit board according to the present invention will be described. First, an electrically conductive substrate 2 used to effect the method of the invention is formed from a rigid single plate, e.g., a planar conductive material of a suitable size, having the maximum effective dimensions of 1,220 by 1,020 mm and a thickness ranging from 1 to 10 mm. Preferably, the material of the conductive substrate 2 is resistant to electrolytic corrosion and chemicals used in a plating step. Examples of such a material include a stainless-steel plate (e.g., hardened SUS-630 as one of the best examples), nickel plate, titanium or titanium-alloy plate, copper or copper-alloy plate, etc. Dirt and oxide film on the surface of conductive substrate 2 are removed, and the surface is pretreated for a necessary roughness (Step S1 of FIG. 1). Preferably, the surface of the conductive substrate 2 is ground within a roughness range of 0.08 to 0.23 μm. The surface roughness of the conductive substrate 2 influences the adhesion strength of a thin metal layer (thin copper film) 5, which is to be formed on the conductive substrate 2 in the next step, and the production of pinholes in the layer 5. Further, the surface roughness of the substrate 2 influences that of the thin metal layer 5. The aforesaid roughness range is set so that the thin metal layer 5 cannot be peeled off unexpectedly during a step of plating conductor circuits 6 or other steps, and can enjoy a good adhesion such that the conductive substrate 2 can be peeled off easily in a peeling step therefor (Step S8 of FIG. 1), as mentioned later. Thus, there is a difference between the adhesion force at an interface 8, between the conductive substrate 2 and the thin metal layer 5, and the adhesion force at an interface 9 (see FIG. 3) between the thin metal layer 5 and a resist film 7, as mentioned later, that is, the adhesion force at the interface 9 is greater than that at the interface 8.

When using a stainless-steel plate as the conductive substrate 2, the conductive substrate 2 is immersed, for example, in a 80 to 100 ml/l sulfuric acid solution at 60° to 70° C., for 10 to 30 minutes, to be descaled. Then, after rinsing, the substrate 2 is immersed, for removal of smut, in a room-temperature solution of 60 to 100 ml/l nitric acid of mixed with acidic solution of 30 g/l ammonium bifluoride, for 10 to 30 minutes. Subsequently, after rinsing, the substrate 2 is subjected to 1 to 2 minutes of cathode-electrolytic degreasing in an electrolytic solution of 20 to 50 g/l sodium phosphate and 50 g/l sodium hydroxide, under the electrolytic conditions of an electrolytic-solution temperature ranging from room temperature to 40° C. and a current value of 3 to 8 A/dm$^2$.

Although the surface of the conductive substrate 2 is roughened chemically in the aforesaid roughening step, it may alternatively be roughened mechanically by wet sand blasting (liquid honing) or the like, after it is cleaned chemically. In the case of the mechanical surface roughening, the substrate surface is heavily polished by means of a rotary buffing apparatus with an oscillator, e.g., a buff of #240 Scotch Bright or thereabout, and is then rinsed. Thereafter, the surface is hairline-finished with use of a buff of #400 to 800 Scotch Bright so that the its roughness falls within the aforementioned range of surface roughness (0.08 to 0.23 μm).

When using a nickel plate as the conductive substrate 2, the substrate 2 is subjected to 1 to 2 minutes of cathode-electrolytic degreasing in an electrolytic solution of 20 to 50 g/l sodium phosphate mixed with 50 g/l sodium hydroxide, under the electrolytic conditions of an electrolytic-solution temperature ranging from room temperature to 40° C. and a current value of 3 to 8 A/dm$^2$, for example. Then, after rinsing, the substrate 2 is immersed, for surface roughening, in a 1 to 10 g/l hydrogen fluoride solution of 50° C. or a 150 ml/l hydrochloric acid solution of 50° C., for 1 to 10 minutes. Subsequently, after rinsing, the substrate 2 is washed in warm water at 40° to 60° C.

When using a titanium or titanium-alloy plate as the conductive substrate 2, the substrate 2 is immersed, for alkaline degreasing, in a 20 to 50 g/l sodium phosphate solution of 50° to 60° C., for 3 to 5 minutes, for example. Then, after rinsing, the substrate 2 is immersed in a 25% hydrofluoric acid (HF) solution and a 75% nitric acid (HNO$_3$) solution to be etched chemically for surface roughening.

When using a copper or copper-alloy plate as the conductive substrate 2, the substrate 2 is subjected to 30 seconds to 2 minutes of cathode-electrolytic degreasing in an electrolytic solution of 20 to 50 g/l sodium phosphate, under the electrolytic conditions of an electrolytic-solution temperature of 50° to 60° C. and a current value of 3 to 10 A/dm$^2$, for example. Then, after rinsing, the substrate 2 is washed in a 1 to 10 g/l hydrogen fluoride of a temperature lower than room temperature, for 30 seconds to 2 minutes, and then in water.

Subsequently, the pre-treated conductive substrate 2, for use as a cathode 1, is opposed to an anode 14 at a predetermined distance of 3 to 30 mm therefrom, and the thin metal layer 5 is precipitated electrolytically (Step S2 of FIG. 1; FIG. 2) on the conductive substrate 2 by the so-called high-speed plating. Copper, nickel, etc., may suitably be used for the thin metal layer 5. The thin metal layer 5 is deposited to a thickness of 1 to 5 μm on the surface of the conductive substrate 2.

Precipitation of copper as the thin metal layer 5 requires high-speed plating conditions such that the cathode is rotated, or the electrolytic solution is supplied compulsorily between fixed electrodes, so that a plating solution of 45° to 70° C. causes a turbulent flow on the surface of the cathode, that is, an interelectrode distance of 3 to 30 mm and an electrode-solution contact speed of 2.6 to 20.0 m/sec are obtained. Preferably, in this case, a copper sulfate plating solution or copper pyrophosphate solution, for example, is used as the plating solution, a current of cathode-current density of 0.15 to 4.0 A/cm$^2$ is applied, and the deposition speed of the thin metal layer is set to 25 to 100 μm/min.

Precipitation of nickel as the thin metal layer 5 requires high-speed plating conditions such that the the cathode and the anode are spaced at a distance of 300 to 350 mm from each other, and an electrolytic solution of 40° to 48° C. is supplied between these electrodes for air stirring. Preferably, in this case, nickel sulfate or nickel sulfamate, for example, is used for the plating solution, a current of cathode-current density of 2.2 to 4.0 A/cm$^2$ is applied, and the deposition speed of the thin metal layer is set to 0.8 to 1.5 μm/min.

Also, a nickel-phosphorus alloy may be used for the thin metal layer 5. The nickel-phosphorus alloy is precipitated on the surface of the conductive substrate by electroless plating. In this case, the electroless plating is performed under the condition that a plating solution of 35° to 55° C. is oscillated so that the solution contact speed at the surface of the conductive substrate 2 ranges from 40 to 80 mm/sec. Preferably, in this case, an electroless nickel solution, containing hypophosphorous acid or boron-based reducing agent, or the like is used as the plating solution, and the deposition speed of the thin metal layer is set to 1 to 2 μm per 30 minutes.

After high-speed electroplating, the thin metal layer 5 is laminated electrolytically on the conductive substrate 2 which has the required surface roughness as aforesaid. Therefore, the thin metal layer 5 is adhered to the conductive substrate 2 with a proper force. Further, its surface roughness is within a suitable range for obtaining a desired adhesion force between the thin metal layer 5 and the resist mask 7 mentioned layer, by high-speed plating under the aforementioned plating conditions. In other words, according to the present invention, the surface roughness of the thin metal layer 5 can be controlled suitably by combining the individual conditions including the surface roughness of the conductive substrate, the solution contact speed of the plating solution, and the electrolytic current density. Thus, the surface of the thin metal layer 5, laminated by the high-speed plating, does not require any special surface treatment after the plating.

Moreover, the conductive substrate 2 made of a stainless-steel or nickel plate is subject to electrochemical defects. These defects include intermetallic compounds, nonmetallic inclusions, segregations, pores, etc. These defects are produced during the manufacture of the stainless-steel plate by fusion, rolling, etc., and cannot be removed by only treating the surface of the conductive substrate 2. Such defects would cause pinholes in the conductor circuits 6. The surface of the thin metal layer 5, which is formed on the surface of the conductive substrate 2, is electrochemically smooth, and the production of pinholes can be prevented by forming the conductor circuits 6, as mentioned later, on the thin metal layer 5.

Figure 2:
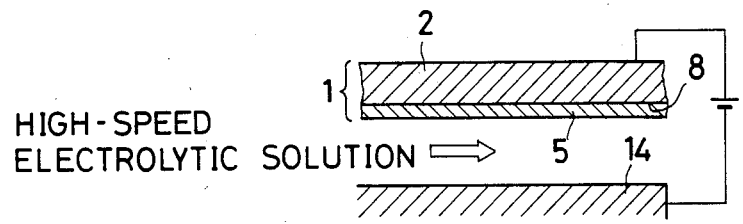
FIG. 2 is a sectional view of the conductor circuit board in a step (S1) of forming a thin metal layer shown in FIG. 1.
Figure 3:
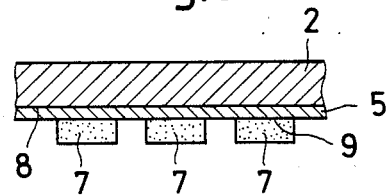
FIG. 3 is a sectional view of the conductor circuit board in a step (S3) of forming a resist mask shown in FIG. 1.

The resist mask 7 is formed (Step S3 of FIG. 1; FIG. 3), by the photoresist method or printing method, on the whole surface of thus formed thin metal layer 5 except those portions thereof on which the conductor circuits 6 are to be formed. Such a resist material is selected that the adhesion force at the interface 9 can be made greater than that at the interface 8, as mentioned before, with the joint effect of the respective surface roughness of the conductive substrate 2 and the thin metal layer 5.

Figure 4:
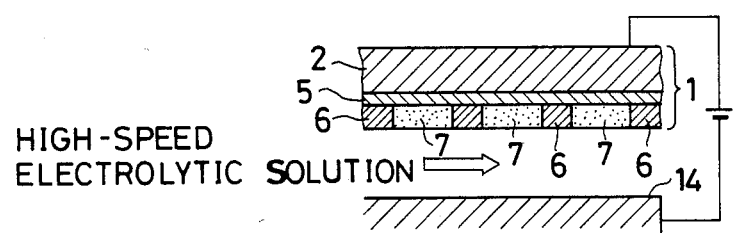
FIG. 4 is a sectional view of the conductor circuit board in a step (S4) of electroforming using copper shown in FIG. 1.

Subsequently, the conductive substrate 2, for use as the cathode 1, with the thin metal layer 5 and the resist mask 7 formed thereon in the aforesaid manner, is opposed to the anode 14 at a predetermined distance (e.g., 3 to 30 mm, preferably, 11 to 15 mm) therefrom, and the conductor circuits 6 are electroformed (Step S4 of FIG. 1; FIG. 4) on the thin metal layer 5 by high-speed plating, using copper. The electrolytic solution used for the high-speed plating may be a copper sulfate plating solution whose metallic copper content ranges from 0.20 to 2.0 mol/l, preferably, from 0.35 to 0.98 mol/l, and whose sulfuric acid content ranges from 50 to 220 g/l. To ensure the uniformity of plating, CUPPORAPID Hs (trade name) produced by LPW Co., Ltd., West Germany, is added to the copper sulfate solution at the rate of 1.5 ml/l. Alternatively, an ordinary plating solution, such as a copper pyrophosphate solution, may be used. Also, the current density, solution contact speed with respect to the electrodes, and electrolytic solution temperature are set to 0.15 to 4 A/cm$^2$, 2.6 to 20 m/sec, and 45° to 70° C., preferably 60° to 65° C., respectively. If the plating solution temperature is lower than 45° C., the moving speed of copper ions is lowered, so that polarized layers are liable to be formed on the surfaces of the electrodes. Thus, the plating deposition speed is lowered. If the solution temperature exceeds 70° C., on the other hand, the evaporation loss of a plating solution 23 increases, so that the concentration of the solution becomes unstable. Also, the increase of the solution temperature puts restrictions on equipment.

By adjusting the current density and the solution contact speed with respect to the electrodes to the aforementioned predetermined conditions, the conductor circuits 6 are deposited on those portions of the thin metal layer 5 which are not covered with the resist mask 7, at a deposition speed of 25 to 100 μm per minute. Thus, copper-electroforming can be performed at an efficiency 20 to 200 times as high as that of the conventional plating method, ensuring very deep practical significance. Moreover, deposited copper particles can be made very fine, so that the conductor circuits 6 can enjoy an elongation percentage of 16 to 25% without losing their tensile strength. This elongation percentage is 1.5 to 2 times the elongation percentage of conductor circuits formed by the conventional plating method (or equal to or higher than that of a rolled annealed copper foil), so that a very soft copper film can be produced. Thus having a property equivalent to that of a rolled annealed copper foil, the copper film can be used particularly effectively for a flexible substrate which requires high bending capability. Moreover, the surface grains of the produced conductor circuits 6 can be reduced in average grain size to a very fine level of 3.0 to 7.5 μm. Accordingly, protuberant precipitates formed in the subsequent roughening (electroplating) step can also be made very fine. Since the conductor circuits 6 are stacked on the thin metal layer 5 which is electrochemically smooth, furthermore, they are free from pinholes even though they have a thickness of 10 μm or less.

When the thickness of the conductor circuits 6 reaches a predetermined thickness (e.g., 2 μm to 300 μm), in the copper-electroforming step, the electric supply and the supply of the plating solution are stopped. After rinsing, the conductor circuits 6 are subjected to electroplating for continued roughening (Step S5 of FIG. 1). The electroplating conditions for this electroplating step for roughening includes a current density of 0.25 to 0.85 A/cm$^2$, interelectrode distance of 26 to 50 mm, and electrolytic solution-electrode contact speed of 0.1 to 0.8 m/sec. The electrolytic solution used, which is not specified in particular, may be a mixed solution of 80 to 150 g/l copper sulfate (CuSO$_4$.5H$_2$O), 40 to 80 g/l sulfuric acid (H$_2$SO$_4$), and 25 to 50 g/l potassium nitrate, for example.

By this roughening process, the protuberant precipitates are adhered to the rough surfaces of the conductor circuits 6. The average particle size of the protuberant precipitates ranges from 1 to 5 μm, and the adhesion to an insulating substrate 10 mentioned later is improved greatly.

After the roughening process described above, if the surfaces of the conductor circuits 6 are further chromate-treated, the affinity between copper and resin in the insulating substrate or a bonding agent increases. Further, the peeling strength naturally increases, and the heat resistance (e.g., soldering heat resistance) of the conductor circuits also increases by 15% or thereabout. More specifically, in this chromate treatment, the conductor circuits 6 are immersed in a 0.7 to 12 g/l potassium bichromate solution at normal temperature for 5 to 45 seconds, or treated with a commercially available electrolytic chromating solution.

Figure 5:
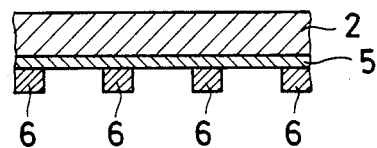
FIG. 5 is a sectional view of the conductor circuit board in a step (S6) of removing the resist mask shown in FIG. 1.

After the roughening process is finished, a step (Step S6 of FIG. 1; FIG. 5) of removing the resist mask 7 is entered. A solution of caustic soda, for example, is used in the removal of the resist mask 7 by peeling, and the conductor circuits 6 are immersed in the solution for 30 to 60 seconds to remove the resist mask 7 therefrom by dissolution. Then, the circuits 6 are rinsed and dried.

Figure 6:
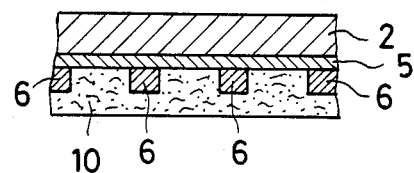
FIG. 6 is a sectional view of the conductor circuit board in a step (S7) of transfer lamination shown in FIG. 1.

Subsequently, the conductor circuits 6, which are formed on the conductive substrate 2 with the interposition of the thin metal layer 5, are stacked together with the thin metal layer 5 and the conductive substrate 2, on the insulating substrate 10, and are pressure-bonded thereto with heat (Step S7 of FIG. 1; FIG. 6) by means of a hot press. Both organic and inorganic materials, such as glass, epoxy resin, phenol resin, polyimide resin, polyester resin, aramid resin, etc., may be used for the insulating substrate 10. Also available are materials which are obtained by enameling the surface of a conductive material, such as iron or aluminum, or by oxidizing the surface of aluminum for alumilite treatment, for insulation. In general, glass cloth or the like is impregnated with epoxy resin, thus forming a prepreg in a semihardened state (B-stage). The insulating substrate 10 is heated and pressurized so that the conductor circuits 6 sink thereinto (state shown in FIG. 6), and is bonded to the circuits 6.

In this transfer step, the conductor circuits 6, along with the thick conductive substrate 2, are stacked on and bonded to the insulating substrate 10 for integral lamination. Thus, the conductor circuits 6 are held on the conductive substrate 2 when they are transferred, so that their dimensional stability is secured. Since the conductive substrate 2 serves also as a transfer jig, moreover, the transfer process requires no special jig. Furthermore, the thin metal layer 5 is sandwiched between the conductor circuits 6 and the conductive substrate 2, and the thin metal layer 5 and the conductor circuits 6 are coupled to one another with a strong force of adhesion. During the transfer operation, therefore, the conductor circuits 6 cannot be dislocated (or undergo a swing as it is called), and are satisfactory in dimensional stability. Thus, the conductor circuits 6 are adapted for even high-density circuits which have a fine conductor circuit pattern (for example, a pattern width of several microns to several tens of microns can be effected). Even if the conductor circuits 6 are subject to pinholes, moreover, the bonding agent or the like cannot be exposed through the pinholes, since the thin metal layer 5 is interposed adherently between the conductor circuits 6 and the conductive substrate 2.

Figure 7:
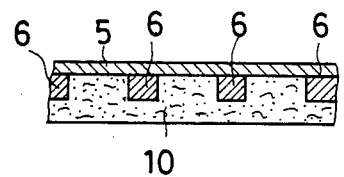
FIG. 7 is a sectional view of the conductor circuit board in a step (S8) of peeling off an electrically conductive substrate shown in FIG. 1.

Then, after the insulating substrate 10 is heated and solidified, the conductive substrate 2 is peeled (Step S8 of FIG. 1; FIG. 7) from the conductor circuits 6, which are transferred to the insulating substrate 10, and the thin metal layer 5. At this time, the force of adhesion between the thin metal layer 5 and the conductor circuits 6 is greater than that between the conductive substrate 2 and the thin metal layer 5. Also, the force of adhesion between the conductor circuits 6 and the insulating substrate 10 is greater than that between the conductive substrate 2 and the thin metal layer 5. Accordingly, the conductive substrate 2 is separated from the thin metal layer 5 at the interface 8, and the thin metal layer 5 and the conductor circuits 6 are adhered integrally on the side of the insulating substrate 10.

Since the thin metal layer 5 is interposed between the conductive substrate 2 and the insulating substrate 10, the bonding agent of the insulating substrate 10 can never adhere directly to the conductive substrate 2. Since the separation is caused between the conductive substrate 2 and the thin metal layer 5, moreover, the conductive substrate 2 can easily be peeled off with a peeling strength of 70 to 120 g/cm. Also, in this case, therefore, the conductor circuits 6 cannot be subjected to any uneven force, and the dimensional stability can be secured.

Figure 8:
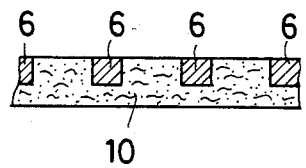
FIG. 8 is a sectional view of the conductor circuit board in a step (S9) of etching the thin metal layer shown in FIG. 1.
Figure 9:
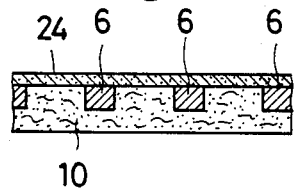
FIG. 9 is a sectional view of the conductor circuit board in a step (S10) of overlay lamination shown in FIG. 1.
Figure 22:
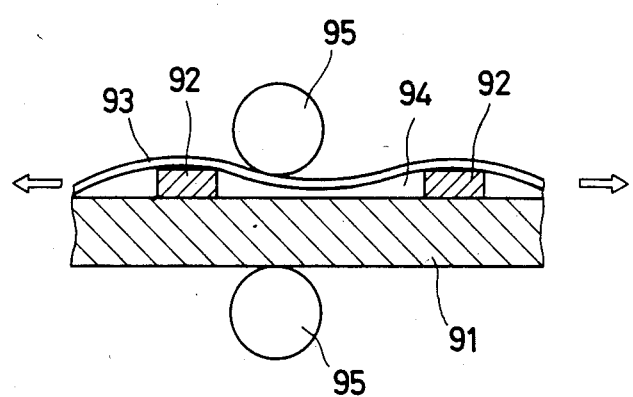
FIG. 22 is a sectional view for illustrating problems of the overlay lamination step caused when producing a conductor circuit board by a prior art method.
Figure 23:
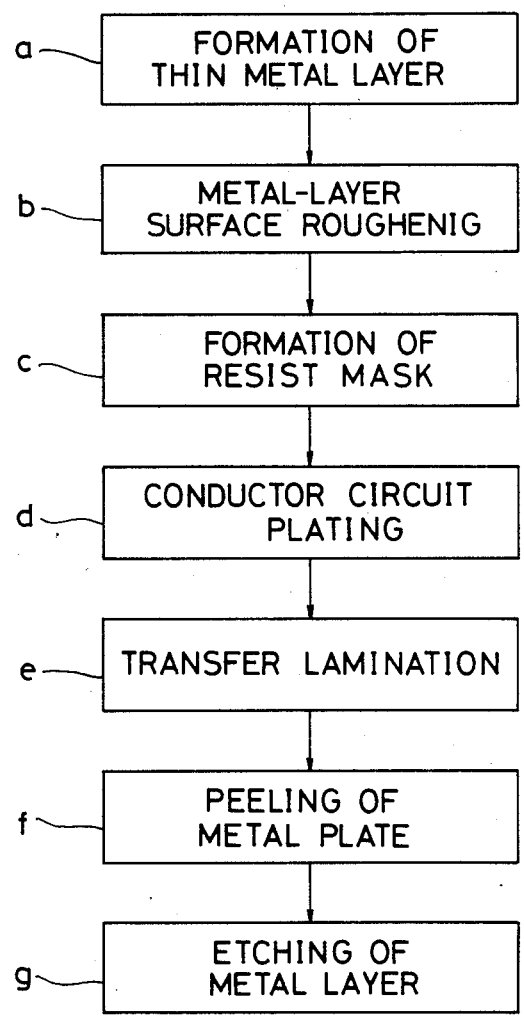
FIG. 23 is a process flow chart for illustrating manufacturing steps of the prior art method of producing a conductor circuit board.

Subsequently, the thin metal layer 5 is removed (Step S9 of FIG. 1; FIG. 8) by etching using an acid or the like. For the ease of the removal by the acid etching, the thin metal layer 5 is preferably formed of copper. The insulating substrate 10, to which the conductor circuits 6 are exposed, is coated with an overlay with a thickness of 6 to 25 μm in order to prevent the conductor circuits 6 from being soiled and from shorting. A film or ink may be used for the overlay. An overlay film is generally used for a flexible substrate, while ink is mainly used for a rigid substrate. Alternatively, a photosensitive resist film or the like may be used for the purpose. When using a overlay film for the coating, the overlay film 24 is stacked on and adhered to the insulating substrate 10 by means of a heat roll (Step S10 of FIG. 1; FIG. 9). As mentioned before, the conductor circuits 6 sink into the insulating substrate 10 so that those surfaces covered by the overlay film 24 are substantially flush, thus forming a so-called flush circuit. Even though a film, for use as an overlay layer, is stacked specially on the flush circuit and pressure-bonded by means of the heat roll, the conductor circuits 6 cannot be dislocated. Unlike the case of a prior art conductor circuit board shown in FIG. 22, moreover, there are no air layers (voids) between the overlay film 24 and the conductor circuits 6, so that the conductor circuits 6 cannot be oxidized.

After the lamination with use of the overlay film 24, the conductor circuit board undergoes a step (Step S11 of FIG. 1) of inner- and outer-shape punching, whereupon it is cut into a predetermined shape and size. Thus, the conductor circuit board is completed.

The thin metal layer 5, conductor circuits 6, and resist mask 7, which are formed on the surface of the conductive substrate 2, are all peeled off. If the surface of the conductive substrate 2 is polished as required, therefore, the conductive substrate 2 can be used repeatedly.

Figure 10:
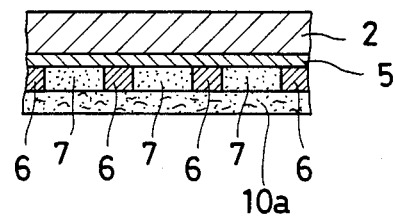
FIG. 10 is a sectional view similar to FIG. 6, showing a step of manufacturing another conductor circuit board according to the method of the present invention.

FIGS. 10 to 13 are sectional views showing part of steps of production based on the method of the present invention, applied to a conductor circuit board in which the resist mask 7 is used as a permanent resist without being removed by dissolution. The steps preceding the step shown in FIG. 10 are identical with those shown in FIGS. 2 to 4. Also, a flow chart of the production steps is the same as the one shown in FIG. 1, except for Step S6 of FIG. 1. Therefore, the other steps other than those shown in FIGS. 10 to 13 will be described with reference to FIG. 1 and FIGS. 2 to 4. In FIGS. 10 to 13, like reference numerals refer to like components as shown in FIGS. 2 to 9. A detailed description of these components is omitted herein.

When using the resist mask 7 as a permanent mask, without removing it by dissolution after the formation of the conductor circuits 6, an electrically nonconductive synthetic resin, such as epoxy or polyamide resin, is used as a resist material. After the roughening (Step S5 of FIG. 1) of the conductor circuits 6 are formed by electroforming using copper, the transfer step or Step S7 of FIG. 1 is executed (FIG. 10) without effecting Step S6 of FIG. 1 for the removal of the resist mask 7. In the transfer process, the conductor circuits 6 and the resist mask 7, formed on the conductive substrate 2 with the interposition of the thin metal layer 5, are stacked together with the thin metal layer 5, resist mask 7, and conductive substrate 2, on the insulating substrate 10, and is pressure-bonded with heat by means of a hot press (Step S7 of FIG. 1; FIG. 10). In this case, the resist mask 7 is interposed between the adjacent conductor circuits 6, and the surfaces of the resist mask 7 and the conductor circuits 6 are even and flush with one another. Therefore, even if a ceramic material or the like is used as the insulating substrate 10, in place of the semi-hardened prepreg, the surfaces of the conductor circuits 6 and the insulating substrate 10 can be adhered to one another without any air layers between them. In this case, a suitable bonding layer is interposed between the insulating substrate 10 and the combination of the conductor circuit 6 and resist mask 7.

Figure 11:
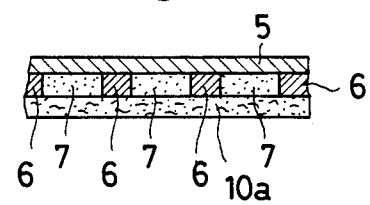
FIG. 11 is a sectional view similar to FIG. 7, showing the manufacturing step of FIG. 10.

Then, the conductive substrate 2 is removed (Step S8 of FIG. 1; FIG. 11) by peeling. At this time, the forces of adhesion between the thin metal layer 5 and the resist mask 7 and between the thin metal layer 5 and the conductor circuits 6 are greater than that between the conductive substrate 2 and the thin metal layer 5. Also, the forces of adhesion between the resist mask 7 and the insulating substrate 10 and between the conductor circuits 6 and the insulating substrate 10 are greater than that between the conductive substrate 2 and the thin metal layer 5. Accordingly, the conductive substrate 2 is separated at the interface 8 between itself and the thin metal layer 5, while the thin metal layer 5, resist mask 7, and conductor circuits 6 are adhered integrally to one another on the side of the insulating substrate 10.

Figure 12:
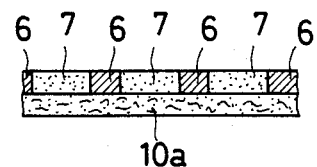
FIG. 12 is a sectional view similar to FIG. 8, showing the manufacturing step of FIG. 10.
Figure 13:
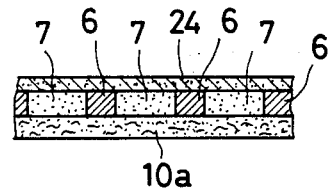
FIG. 13 is a sectional view similar to FIG. 9, showing the manufacturing step of FIG. 10.

Subsequently, the thin metal layer 5 is removed (Step S9 of FIG. 1; FIG. 12) by etching using an acid or the like. The overlay film 24 is coated adherently (Step S10 of FIG. 1; FIG. 13) on the surface of the conductor circuits 6 and the resist mask 7 by means of the heat roll. The conductor circuits 6 are arranged with the resist mask 7 between them, and their surfaces are flush with one another. Therefore, no air layers (voids) can exist between the overlay film 24 and the conductor circuits 6. Even when applying heat and pressure by means of the heat roll, moreover, the conductor circuits 6 can never be dislocated.

Figure 14:
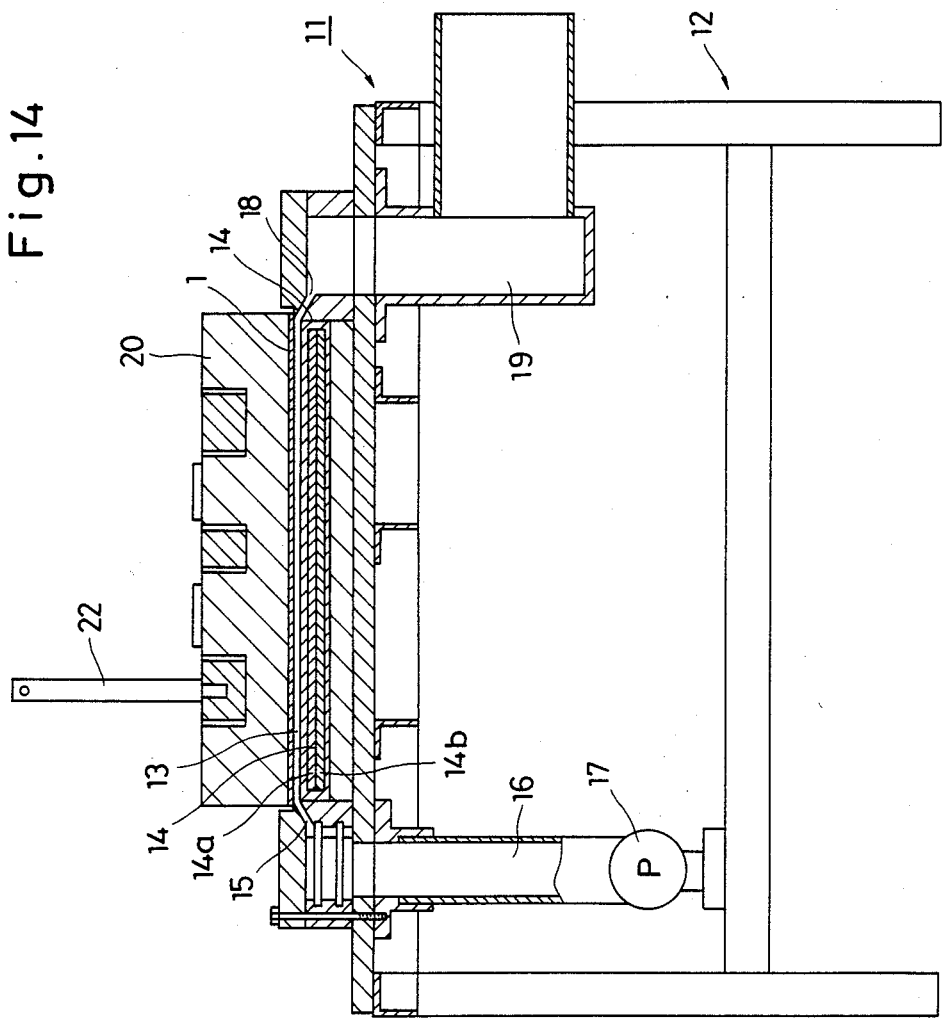
FIG. 14 is a front sectional view showing an arrangement of a high-speed plating apparatus of a horizontal type.
Figure 15:
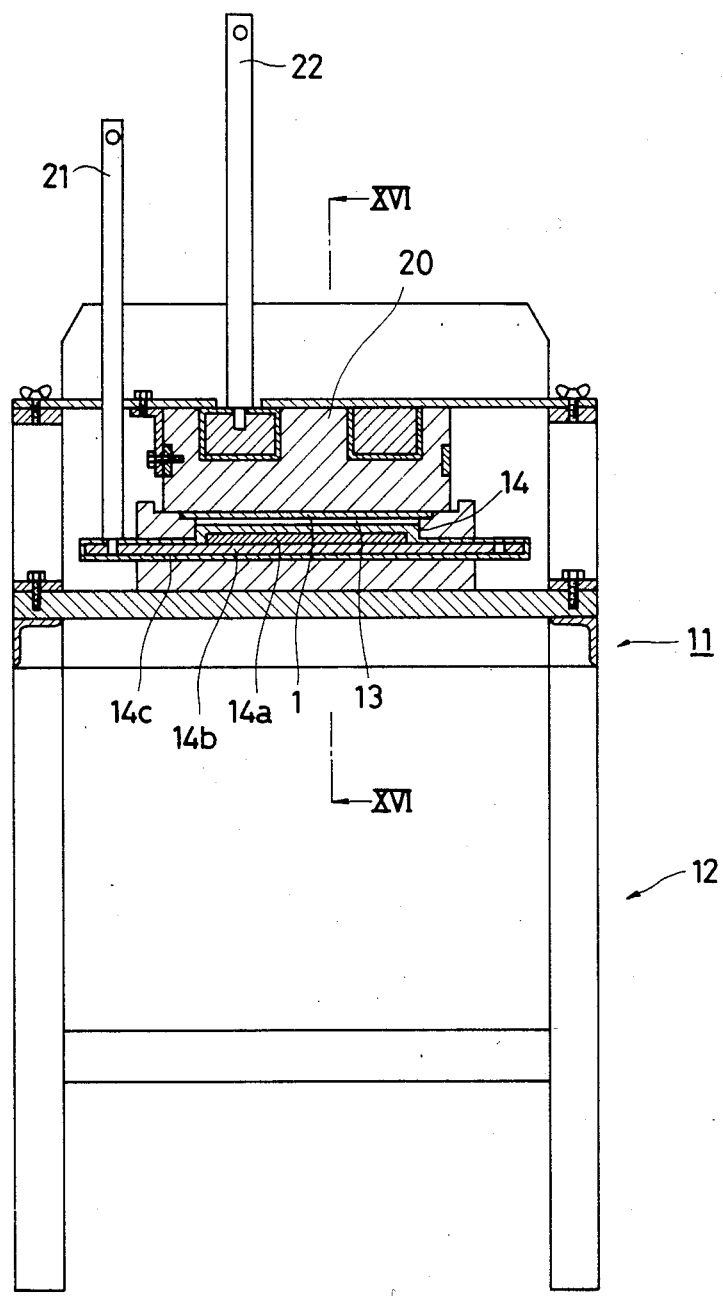
FIG. 15 is a side view of the high-speed plating apparatus of FIG. 14.
Figure 16:
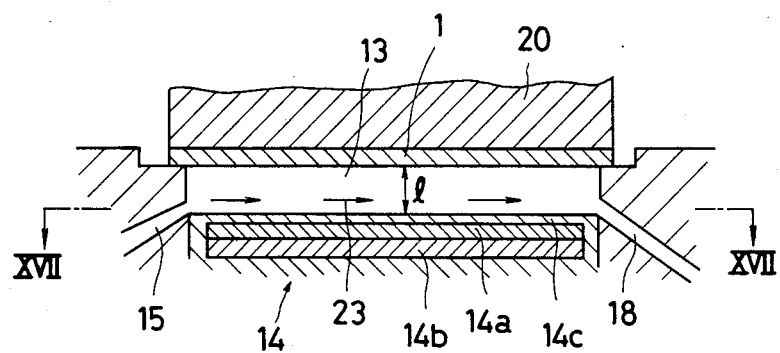
FIG. 16 is a sectional view taken along line XVI—XVI of FIG. 15.

FIGS. 14 to 17 show an example of a horizontal plating apparatus for effecting high-speed plating in Steps S2 and S4 of FIG. 1. The planar insoluble anode 14 is set horizontally in the center of the top portion of the frame 12 of the plating apparatus 11, and the cathode 1 is fixed facing the anode 14 so as to extend parallel thereto. As shown in FIGS. 14 to 16, the insoluble anode 14 includes two copper plates 14a and 14b joined together in order to permit a large current flow. A lead coating 14c is deposited uniformly to a thickness within a range of 2 to 10 mm, preferably 3 to 7 mm, over the whole surfaces of the copper plates 14a and 14b, by means of an acetylene torch or the like. Usually, a lead alloy containing 93% lead and 7% tin is used for the lead coating 14c. If the interelectrode distance is subject to an irregularity of 100 $\mu$m, an electroformed copper film of 35 $\mu$m thickness is subject to a variation of several microns. When using the copper film with a high-current density (0.8 to 1.2 A/cm$^2$) for a long period of time (1,000 hours or more), the variations of the film thickness increases due to partial electrolytic dissipation of the electrode. Therefore, the interelectrode distance must be maintained by reprocessing the electrode. Instead of using the electrode coated with lead, the insoluble anode 14 may be formed by applying a pasty mixture of thermopolymerizable resin and impalpable powder of platinum or palladium to the surface of a titanium plate with a roughened surface, and then baking the coated plate at 700° to 800° C. With use of such a titanium-plate anode, electrolytic dissipation is reduced considerably, and the electrode need not be reprocessed even after prolonged use (for 1,000 hours or more).

The cathode 1 is fixedly mounted so that the polished surface of the conductive substrate 2, polished in Step S1, faces the anode 14 in the step of forming the thin metal layer or Step S2 of FIG. 1, and that the surface of the conductive substrate 2 formed with the thin metal layer 5 and the resist mask 7 faces the anode 14 in the step of electroforming the conductor circuits or Step S4 of FIG. 1. The distance between the cathode 1 and the insoluble anode 14 is adjusted to values best suited for the step of forming the thin metal layer 5 and the step of electroforming the conductor circuits 6, individually.

Figure 17:
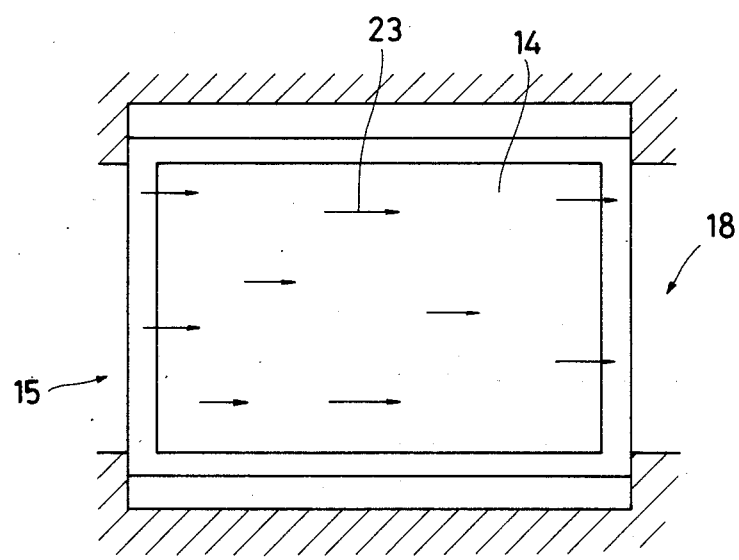
FIG. 17 is a sectional view taken along line XVII—XVII of FIG. 16.

One end of a nozzle 15, which serves to feed the plating solution 23 at high speed, is connected to the inlet side of a cavity portion 13 between the cathode 1 and the insoluble anode 14. At the inlet portion of the cavity portion 13, the nozzle 15 opens so as to cover the substantially overall width of the insoluble anode 14, as shown in FIG. 17. The other end of the nozzle 15 is connected to a pump 17 by means of a duct 16. Further, the pump 17 is connected to a plating solution tank (not shown) by means of another duct (not shown). On the outlet side of the cavity portion 13 (on the opposite side of the insoluble anode 14 to the location of the nozzle 15), an exhaust port 18 opens so as to cover the substantially overall width of the insoluble anode 14. The exhaust port 18 is connected to the plating solution tank by means of a duct 19. The cross-sectional shapes of the nozzle 15 and the exhaust port 18, with respect to the direction of the solution flow, vary smoothly so that the plating solution 23 can flow with a uniform speed distribution, in the cavity portion 13. The plating solution 23 discharged from the pump 17 is returned to the plating solution tank successively through the duct 16, the nozzle 15, the cavity portion 13 between the cathode 1 and the insoluble anode 14, the exhaust port 18, and the duct 19. Thereafter, the plating solution 23 is circulated continuously through the aforesaid route by the pump 17 again.

When the plating solution 23 is fed from the nozzle 15 to the interelectrode cavity portion 13 at the aforementioned suitable plating speed, the flow of the plating solution is disturbed in the vicinity of the surface of the cathode 1. Thus, the plating film can be developed at high speed by suppressing the growth of a polarized layer in order to prevent the metallic-ion concentration in the vicinity of the surface of the electrode from lowering extremely.

In the plating step according to the present invention, the aforesaid required high current is fed between the cathode 1 and the insoluble anode 14 through the medium of a feeder plate 20 having high electrical conductivity and chemical resistance to copper, graphite, lead, etc., an anode power supply cable 21, and a cathode power supply cable 22. Thus, the copper film can be electrolytically precipitated, at a deposition speed of about 25 to 100 $\mu$m per minute, on that surface of the cathode 1 facing the insoluble anode 14 and those portions of the cathode 1 not covered by the nonconductive resist mask 7.

Figure 18:
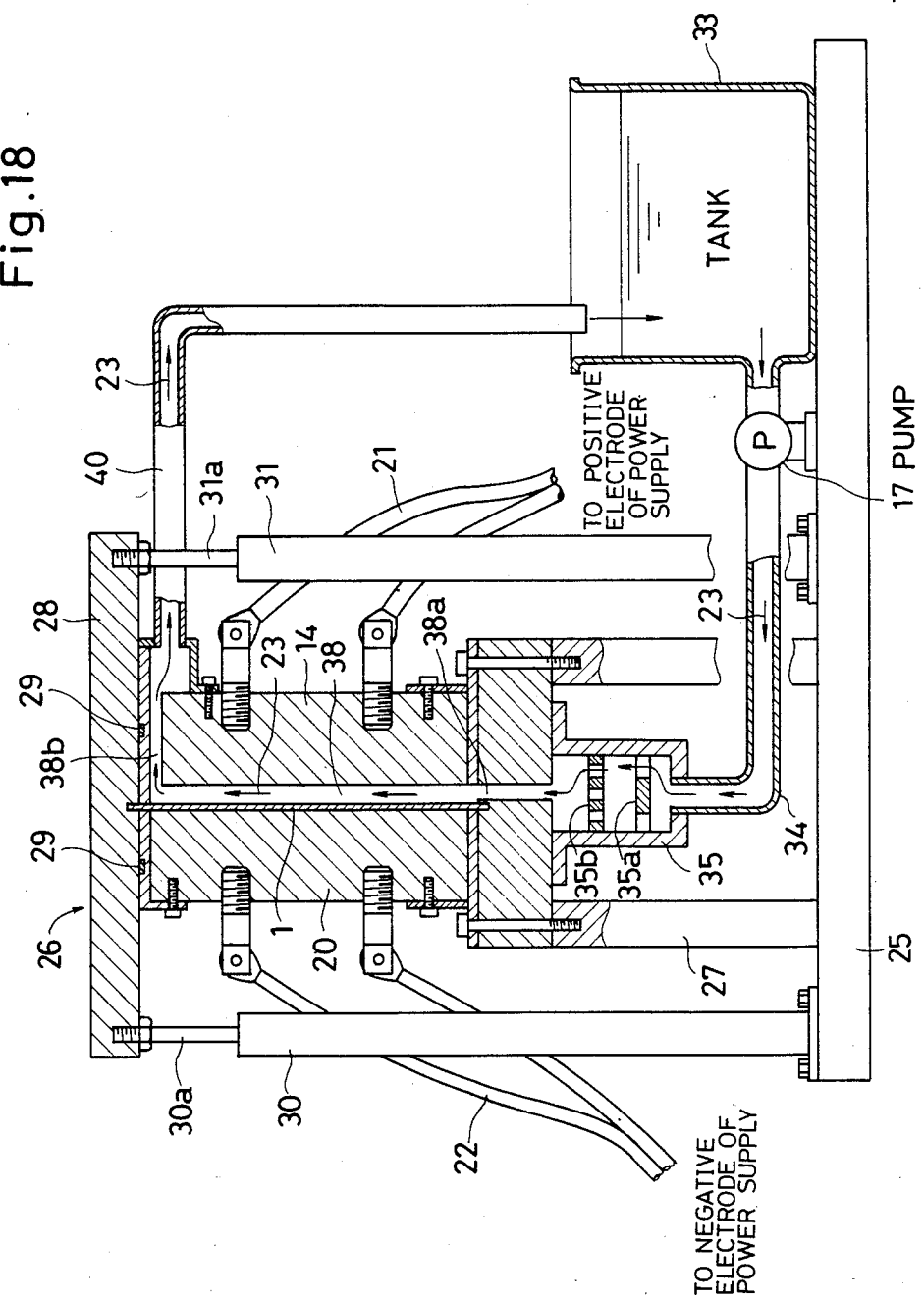
FIG. 18 is a front sectional view showing an arrangement of a high-speed plating apparatus of a vertical type.

FIG. 18 shows a vertical plating apparatus for effecting the method of the present invention. Whereas the cathode 1 and the anode 14 in the plating apparatus 11 shown in FIGS. 14 to 17 are arranged horizontally, the plating apparatus 25 shown in FIG. 18 differs from the apparatus 11 in that its cathode 1 and insoluble anode 14 are arranged vertically. In FIG. 18, like reference numerals are used to designate like portions having substantially the same functions as their counterparts in the plating apparatus 11 shown in FIGS. 14 to 17. A detailed description of those portions is omitted herein (and the same will apply hereinafter).

The plating apparatus 25 comprises a stand 27 fixed on a baseplate 26, posts 30 and 31 (only two posts are shown in FIG. 18) arranged at the four corners of a quadrilateral, a top plate 28 horizontally supported by telescopic rods 30a and 31a, and a highly conductive feeder plate 20 and the insoluble anode 14 fixed between the top surface of the stand 27 and the undersurface of the top plate 28 so as to face each other, extending vertically and parallel to each other. The rods 30a and 31a can be extended or contracted vertically, and the top plate 28 moves up or down as the rods 30a and 31a extend or contract. The feeder plate 20 and the anode 14 are spaced at a predetermined interelectrode distance. Like the anode shown in FIGS. 14 to 16, the insoluble anode 14 is formed of a titanium plate coated with impalpable powder of platinum or the like, which permits a large current flow.

The cathode 1 is fixedly mounted by means of a vacuum chuck (not shown) or the like so that the polished surface of the conductive substrate 2, polished in Step S1, faces the feeder plate 20 in the step of forming the thin metal layer or Step S2 of FIG. 1, and that the surface of the conductive substrate 2 formed with the thin metal layer 5 and the resist mask 7 faces the feeder plate 20 in the step of electroforming the conductor circuits or Step S4 of FIG. 1. In mounting the cathode 1, the top plate 28 is moved up, and the cathode 1 is inserted along that surface of the feeder plate 20 on the side of the anode 14, and is fixed by means of the vacuum chuck or the like. Thereafter, the top plate 28 is lowered again to be adhered to the respective top walls of the anode 14 and the feeder plate 20. Thus, the mounting of the cathode 1 is completed. In FIG. 18, numeral 29 denotes an O-ring for sealing. The distance between the cathode 1 and the insoluble anode 14 is adjusted to values best suited for the step of forming the thin metal layer 5 and the step of electroforming the conductor circuits 6, individually.

A ramp portion 38a, into which the plating solution 23 is flows at high speed, is formed on the inlet side of a cavity portion 38 between the cathode 1 and the insoluble anode 14. At the inlet portion of the cavity portion 38, the ramp portion 38a opens so as to cover the substantially overall width of the insoluble anode 14, in the same manner as shown in FIG. 17. The opposite side of the ramp portion 38a to the cavity portion 38 is connected to a pump 17 by means of a rectifying unit 35 and a duct 34. Further, the pump 17 is connected to a plating solution tank 33. On the outlet side of the cavity portion 38 (on that side of the cavity portion 38 at the upper portion thereof for the discharge of the plating solution 23), an exhaust port 38b opens so as to cover the substantially overall width of the insoluble anode 14. The exhaust port 18 is connected to the plating solution tank 33 by means of a duct 40.

The internal space of the rectifying unit 35 is divided into by means of two rectifying plates 35a and 35b which, each having a number of perforations, are arranged in the flowing direction of the plating solution 23. The rectifying plates 35a and 35b serve to rectify the flow of the plating solution 23 flowing into the ramp portion 38a, thereby equalizing the speed distribution of the plating solution 23 flowing upward through the cavity portion 38. The plating solution 23 discharged from the pump 17 is returned to the plating solution tank 33 successively through the duct 34, the rectifying unit 35, the ramp portion 38a, the cavity portion 38 between the cathode 1 and the insoluble anode 14, the exhaust port 38b, and the duct 40. Thereafter, the plating solution 13 is circulated continuously through the aforesaid route by the pump 17 again.

The plating apparatus 25 shown in FIG. 18 feeds the plating solution 23 further upward to the interelectrode cavity portion 13 through the rectifying unit 35. Therefore, the plating solution 23 in the cavity portion 13 has a turbulence speed distribution more uniform than that of the plating apparatus 11 shown in FIG. 14. Such a situation is well suited for the electroforming of conductor circuits of a uniform thickness.

Also in the plating apparatus shown in FIG. 18, the aforesaid required high current is fed between the cathode 1 and the insoluble anode 14 through the medium of a feeder plate 20 having high electrical conductivity and chemical resistance to copper, graphite, lead, etc., an anode power supply cable 21, and a cathode power supply cable 22. Thus, the copper film can be electrolytically precipitated, at a deposition speed of about 25 to 100 μm per minute, on that surface of the cathode 1 facing the insoluble anode 14 and those portions of the cathode 1 not covered by the nonconductive resist mask 7.

Figure 19:
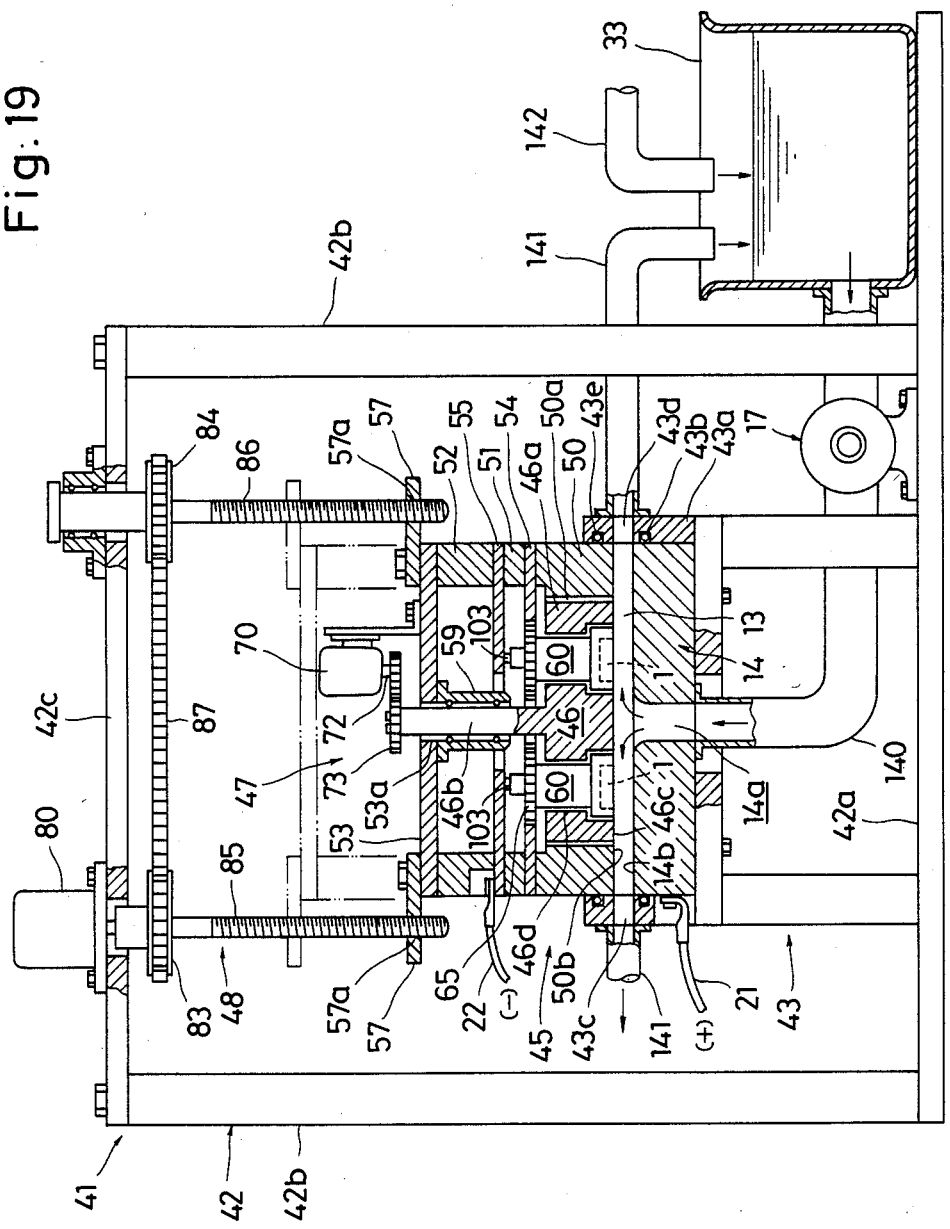
FIG. 19 is a cutaway front view showing an arrangement of a high-speed plating apparatus of a rotary type.
Figure 20:
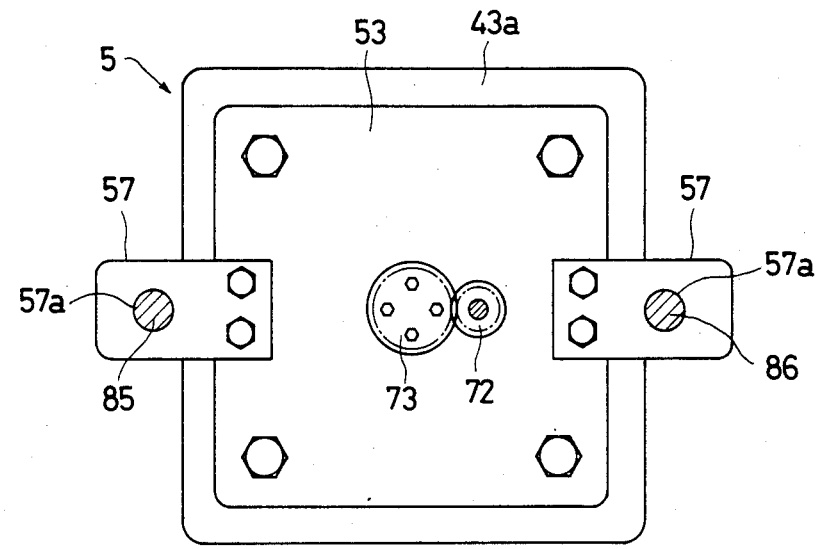
FIG. 20 is a top view of a housing shown in FIG. 19.
Figure 21:
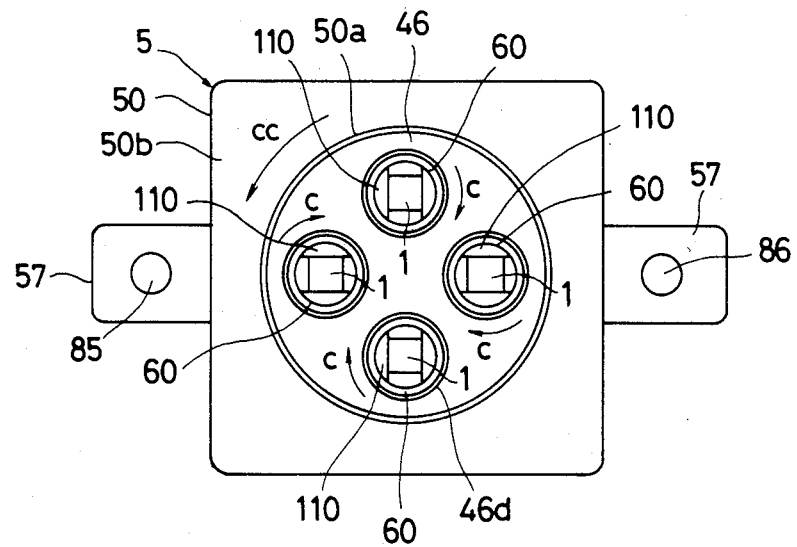
FIG. 21 is a bottom view of the housing shown in FIG. 19.

FIGS. 19 to 21 show a rotary high-speed plating apparatus 41 for effecting the method of the present invention. The plating apparatus 41 comprises a frame 42, a stand 43 disposed inside the frame 42 and bearing the insoluble anode 14 thereon, a housing 45 located above the anode 14, a rotating body 46 rotatably contained in the housing 45 and adapted to hold the cathodes 1, and a drive mechanism 47 for driving the rotating body 46. The apparatus 41 further comprises a drive mechanism 48 disposed at the upper portion of the frame 42 and serving to raise and lower the housing 45, a plating solution tank 33 storing the plating solution, and a pump 17 for feeding the plating solution in the plating solution tank 33 into a liquid-tight cavity portion 13 defined between the respective opposite end faces of the anode 14 and the rotating body 46.

The frame 42 includes four posts 42b, 42b (only two of them are shown) set up on a baseplate 42a, and a top plate 42c fixed on the respective upper end faces of the posts 42b, 42b. The stand 43 is mounted on the baseplate 42a so as to be situated substantially in the center of the arrangement of the four posts 42b of the frame 42.

The insoluble anode 14 is a square board fixed on the stand 43. A hole 14a is bored substantially through the center of the anode 14. The anode 14 is formed, for example, of a base material of titanium and an oxide of platinum or iridium deposited thereon to a thickness of 20 to 50 μ. Thus, the anode 14 is an insoluble anode which never causes the plating solution to change its composition, and can prevent penetration of impurities. A frame body 43a is fitted on the anode 14 in a liquid-tight manner with the aid of a seal member 43b. The height of the frame body 43a is substantially twice the thickness of the anode 14. Holes 43c and 43d are bored substantially through the respective centers of two facing side walls of the frame body 43a.

The housing 45, which is square in shape as viewed from above (FIG. 20), is composed of a lower frame 50, an intermediate frame 51, an upper frame 52, a top lid 53, an inner gear 54 interposed between the lower and intermediate frames 50 and 51, and a slip ring 55 for current collection interposed between the intermediate and upper frames 51 and 52. All these members are firmly fixed together for integral formation. A large-diameter hole 50a, used to contain the rotating body, is bored through the center of the lower frame 50 of the housing 45. Supporting members 57, 57 are fixed individually to two opposite sides of the upper surface of the top lid 53, protruding sideways therefrom.

The rotating body 46 is contained in the housing 45, and its basal portion 46a is rotatably housed in the hole 50a of the lower frame 50 of the housing 45 with a narrow gap left between the basal portion 46a and the lower frame 50. The upper end of a shaft 46b is rotatably supported by the top lid 53, projecting upward through a shaft hole 53a in the top lid 53. In this state, a lower end face 46c of the basal portion 46a of the rotating body 46 faces a top surface 14b of the anode 14 in parallel relation at a predetermined distance therefrom.

As shown in FIGS. 19 and 21, a plurality of holes 46d, e.g., four in number, are bored through the basal portion 46a of the rotating body 46, extending parallel to the axial direction and arranged at regular intervals in the circumferential direction. A second rotating body 60 is rotatably contained in each of these holes 46d. The rotating body 60 is rotatably supported in the hole 46d, with a narrow gap around it, by means of a bearing (not shown). The cathode 1 is grasped and fixed in a hole in the lower end face of each rotating body 60 by means of a chuck mechanism 110. The cathodes 1 are electrically connected to the slip ring 55 by means of their corresponding conductive members (not shown) and brushes 103. A gear 65 is fixed on the upper end face of each rotating body 60. The gears 65 are in mesh with the inner gear 54 attached to the housing 45.

A motor 70 for driving the drive mechanism 47 (FIG. 19) is fixedly mounted on the top lid 53 of the housing 45. A gear 72, which is mounted on the rotating shaft of the motor 70, is in mesh with a gear 73 which is fixedly screwed on the upper end face of the shaft 46b of the rotating body 46.

A motor 80 for driving the drive mechanism 48 is fixedly mounted on the top plate 42c of the frame 42 shown in FIG. 19. The motor 80 serves to drive a screw shaft 85 and also to drive a screw shaft 86, for use as a driven shaft, through the medium of a pulley 83, a belt 87, and a pulley 83. The respective free ends of the screw shafts 85 and 86 are screwed individually in threaded holes 57a, 57a of their corresponding supporting members 57, 57 of the housing 5.

Power supply cables 21 and 22 are fixed to one side face of the anode 14 (FIG. 19) and a predetermined position of the upper surface of the slip ring 55, respectively.

One end of a plating solution passage (duct) 140 is connected in a liquid-tight manner to the hole 14a of the anode 14 from below the anode. The other end of the passage 140 communicates with the plating solution tank 33 through the pump 17. Open ends of passages 141 and 142, on one side thereof, are connected in a liquid-tight manner to the holes 43c and 43d, respectively, of the frame body 43a of the anode 14. The respective other ends of the passages 141 and 142 are connected to the plating solution tank 33.

The operation of the rotary high-speed plating apparatus 41 will now be described. First, the motor 80 for the drive mechanism 48 is driven to rotate the screw shafts 85 and 86, so that the housing 45 is raised to and stopped at an upper limit position indicated by two-dot chain line in FIG. 19. At this time, the lower end of the housing 45 is situated off and above the frame body 43a.

Then, the second rotating bodies 60 of the rotating body 46 are fitted individually with the cathodes 1 which are each composed of the conductive substrate 2 to be plated. The motor 80 for the drive mechanism 48 is driven to rotate the screw shafts 85 and 86 reversely to the aforesaid case, so that the housing 45 is moved to and stopped at the position indicated by full line in FIG. 19. In this state, the lower end of the housing 45 is fitted in the frame body 43a in a liquid-tight manner, and the top surface 14b of the anode 14 and the individual cathodes face parallel to one another at a predetermined distance. The plating solution is fed from the plating solution tank 33 into the liquid-tight cavity portion 13, defined between the top surface 14b of the anode 14 and the lower end face 46c of the rotating body 46, via the pump 17 and the duct 140. Thus, the cavity portion 13 or the space between the anode 14 and the cathodes 1 is filled with the plating solution. The plating solution fed into the cavity portion 13 is returned to the plating solution tank 33 from either side through the passages 141 and 142.

After the supply of the plating solution is started, the motor 70 for the drive mechanism 47 is driven to rotate the rotating body 46, for example, in the counterclockwise direction, as indicated by arrow CC in FIG. 21. As the rotating body 46 rotates in this manner, the second rotating bodies 60 are rotated in the clockwise direction, as indicated by arrows C in FIG. 21, through the medium of the inner gears 65 in mesh with the inner gear 54. These rotating bodies 60 rotate (or revolve on their own axes) at a rotating speed of, e.g., 10 m/sec to 30 m/sec. If the rotating bodies 60 or the cathodes 1 rotated at such a speed in the plating solution, the polarized layer of the metallic concentration of the plating solution in contact with the cathodes 1 becomes very fine, so that the Reynolds number Re of the plating solution flow exceeds 2,900 (Re>2,900). For any portion of the plating solution in contact with the cathodes 1, moreover, the Reynolds number Re is not less than 2,300 (Re>2,300).

The aforementioned DC power source is turned on with the metallic-concentration polarized layer of the plating solution, in contact with the cathodes 1, kept very fine, thereby causing a required DC current to flow successively through the power supply cable 21, anode 14, plating solution, cathodes 1, carbon brushes 103, slip ring 55, and power supply cable 22. Thus, those end faces of the cathodes 1 opposed to the top surface 14b of the anode 14 are plated.

After the passage of a predetermined time, the aforesaid current supply is interrupted to stop the operations of the pump 17 and the drive motor 70, thereby bringing the plating of the cathodes 1 to an end. The cathodes 1 are removed from the rotating bodies 60 by reversely following the aforementioned process of their mounting.

In the rotary high-speed plating apparatus, the cathodes are rotated at high speed in the plating solution in order to make the metallic-concentration polarized layer of the plating solution very fine, so that the plating solution can be supplied to the liquid-tight cavity portion 13 at only a low flow rate. Accordingly, some advantages, such as miniaturization of the pump, economy of electric power, reduction in running cost, etc., can be obtained. Further, there is no need of an approach run of the plating solution for the very fine polarized layer of the metallic concentration of the plating solution, which has conventionally been required. Consequently, such a favorable effect as a reduction of the apparatus size can be enjoyed.

Thus, according to the method of the present invention, high-speed plating is performed by means of the high-speed plating apparatus shown in FIGS. 14 to 21, permitting electrolytic precipitation of copper film at an efficiency 10 to 200 times as high as that of the conventional plating technique, and ensuring a very efficiency of production. By setting the plating solution speed, current density, etc., according to the predetermined conditions, moreover, the surface roughness of electrolytically precipitated copper film and the size of deposited crystalline particles can be adjusted to desired values.

The high-speed plating apparatus for effecting the method of the present invention is not limited to the apparatus described above, and must only be a plating apparatus which can provide a turbulence with the Reynolds number Re of about 2,300 or more.

Examples according to the present invention will now be described.

Table 1 shows the results of an evaluation test on conductor circuit boards produced by the method of the present invention and methods for comparison. In this evaluation test, the transferability, the peeling strength between the conductor circuits 6 and the insulating substrate 10, the elongation percentage of the conductor circuits 6, etc., were evaluated varying several conditions including the surface roughness of the conductive substrate 2, the electrolytic conditions for the thin metal layer 5 and the conductor circuits 6, and the conditions for the roughening process. The following are other testing conditions than those shown in Table 1, which are common to all the sample circuit boards. The resist mask was removed by dissolution after roughening the conductor circuits.

TABLE 1

| Items | Surface Roughness of Conductive Substrate (μm) | Electrolytic Conditions for Thin Metal Layer | | | Electrolytic Conditions for Conductor Circuits | | |
|---|---|---|---|---|---|---|---|
| | | Current Density (A/cm) | Solution Contact Speed (m/sec) | Evaluation | Current Density (A/cm) | Solution Contact Speed (m/sec) | Evaluation |
| Example 1 | 0.13 | 1.2 | 8 | ○ | 2.0 | 20 | ○ |
| Example 2 | 0.18 | 1.2 | 8 | ○ | 1.2 | 10 | ○ |
| Example 3 | 0.18 | 2.0 | 8 | ○ | 1.2 | 4 | ○ |
| Control 1 | 0.06 | 0.4 | 3 | X | — | — | — |
| Control 2 | 0.25 | 0.8 | 6 | ○*3 | 1.2 | 10 | ○ |
| Control 3 | 0.13 | — | — | — | 2.0 | 20 | ○ |
| Control 4 | 0.23 | 2.0 | 20 | ○ | 4.0 | 22 | X |
| Control 5 | 0.25 | 2.0 | 20 | ○*3 | 4.2 | 20 | X |
| Control 6 | 0.08 | 0.8 | 6 | ○*3 | 1.2 | 10 | ○ |

| Items | Electrolytic Conditions for Roughening Process | | | Evaluation on Transfer Lamination | | | |
|---|---|---|---|---|---|---|---|
| | Current Density (A/dm$^2$) | Solution Contact Speed (m/sec) | Evaluation | Transferability*1 | Peeling Value Strength (kg/cm)*2 | Elongation % of Copper Circuit | Synthetic Evaluation |
| Example 1 | 36 | 0.2 | ○ | ○ 130 | ○ 1.9 | 23 | ○ |
| Example 2 | 40 | 0.3 | ○ | ○ 150 | ○ 2.1 | 18 | ○ |
| Example 3 | 40 | 0.3 | ○ | ○ 150 | ○ 2.1 | 18 | ○ |
| Control 1 | — | — | — | — | — | — | X |
| Control 2 | 40 | 0.3 | ○ | X 310 | ○ 2.1 | 22 | X |
| Control 3 | 36 | 0.2 | ○ | X | ○ 1.6 | 23 | X |
| Control 4 | 36 | 0.2 | ○ | ○ | ○ 1.9 | 23 | X |
| Control 5 | 36 | 0.3 | ○ | X 310 | ○ 1.9 | 25 | X |
| Control 6 | 18 | 0.2 | X | ○ 90 | X 0.7 | 22 | X |

Circles indicate nondefectiveness.
Crosses indicate defectiveness.
*1Figures indicate peeling values between conductive substrate and thin metal layer.
*2Figures indicate peeling values between conductor circuits and insulating substrate.
*3Many pinholes.
Conductive Substrate:
Material: Single hardened stainless-steel plate (SUS630).
Surface Treatment: Polishing to the roughness shown in Table 1 by using a rotary buffing apparatus with oscillator.
Thin Metal Layer:
Material: Thin copper film (deposited to a thickness of 3 μm on the surface of the conductive substrate).
Electrolytic Conditions: Interelectrode distance of 11 mm; use of a copper sulfate plating solution containing 180 g/l sulfuric acid.
Conductor Circuit Electroforming:
Electrolytic Conditions: Interelectrode distance of 11 mm; use of a copper sulfate plating solution containing 180 g/l sulfuric acid; deposited film thickness of 35 μm (9 μm for Control 3).
Roughening Process: (Nodular plating)
Electrolytic Conditions: Use of a mixed solution containing 100 g/l copper sulfate, 50 g/l sulfuric acid, and 30 g/l potassium nitrate; deposited film thickness of 3 μm.
Insulating Substrate:
Material: Glass-epoxy G-10.

In Table 1, the surface roughness of the conductive substrate (single plate) 2, the electrolytic conditions for the thin metal layer 5 and the conductor circuits 6, and the roughening conditions for the conductor circuits 6 of Examples 1 to 3, prepared by the method of the present invention, all comply with the requirements provided by the present invention. The transferability, the peeling strength between the conductor circuits 6 and the insulating substrate 10, and the elongation percentage of the conductor circuits 6 are all satisfactory, and the synthetic evaluations for Examples 1 to 3 are all "nondefective" (circles).

In Control 1 in which the surface roughness of the conductive substrate (single plate) 2 is lower than its lower limit value provided by the method of the present invention, on the other hand, the thin metal layer is separated (peeled too early) from the conductive substrate (single plate) 2 during its formation. In Control 2 in which the surface roughness exceeds its upper limit value, the adhesion strength between the conductive substrate (single plate) 2 and the thin metal layer 5, during the transfer step, is so great (peeling value: 310 g/cm) that the thin metal layer 5 partially remains on the conductive substrate 2, thereby causing a circuit dislocation. If the surface roughness of the conductive substrate 2 is great, moreover, a number of pinholes are produced in the thin metal layer 2. When the insulating substrate 10 is stacked for lamination, the bonding agent of the insulating substrate penetrates pinholes produced in those portions of the thin metal layer from which the resist mask is removed. The bonding agent in the pinholes sticks to the surface of the conductive substrate 2, so that the insulating substrate 10 and the conductive substrate 2 adheres so strongly to each other that the transferability is lowered. When one or more pinholes with a diameter of 100 $\mu$m or less existed per 1 $dm^2$, the pinholes in all were regarded as many.

If the resist mask 7 and the conductor circuits 6 are formed directly on the conductive substrate 2 without forming the thin metal layer 5 on the conductive substrate 2, pinholes are produced in the conductor circuits 6 (9 $\mu$m thick). If the resist mask 7 and the conductor circuits 6 are transferred in a body, the strength of adhesion between the resist mask 7 and the conductive substrate 7 is so great that the resist mask 7 remains on the surface of the conductive substrate 2 at the time of the transfer process. If the conductor circuits 6 are transferred after the resist mask 7 is removed, the insulating substrate 10 and the conductive substrate 2 are caused to adhere to each other by the bonding agent, so that it is difficult to peel off the conductive substrate 2. In any case, the transferability is lowered considerably (Control 3).

If the solution contact speed of the electrolytic solution exceeds its upper limit value provided by the method of the present invention when the conductor circuits 6 are electrolyzed, the resist mask 7 is peeled off during the electrolysis (Control 4). If the current density exceeds its upper limit value provided by the method of present invention, nodular plating or the so-called "plating scald" is caused, and the elongation percentage of the conductor circuits 6 is as low as 8%. Thus, these circuits cannot be used for flexible substrates (Control 5).

If the current density at the time of electroplating, in the process of roughening the surfaces of the conductor circuits 6, is lower than its lower limit value provided by the method of the present invention, the plated surface is lustrous and cannot enjoy rough-surface plating (Control 6). If only insufficiently roughened conductor circuits 6 are transferred to the insulating substrate 10, the peeling value obtained between the conductor circuits 6 and the insulating substrate 10 is 0.7 kg/cm, which indicates lack of adhesion strength.

Thus, Controls 1 to 6, in which some of the conditions including the surface roughness of the conductive substrate 2, the electrolytic conditions for the thin metal layer 5 and the conductor circuits 6, and the roughening conditions for the conductor circuits 6 are not in compliance with the requirements provided by the present invention, are subject to the drawbacks as aforesaid. The synthetic evaluations for Controls 1 to 6 are all "defective" (crosses).

INDUSTRIAL AVAILABILITY

In a method of producing conductor circuit boards according to the present invention, a thin metal layer is interposed between conductor circuits and a conductive substrate. Therefore, the conductor circuits, which are formed by plating, cannot easily suffer pinholes or other defects, and can be transferred with ease, thus enjoying high dimensional stability and ensuring steady production of fine circuit patterns. Accordingly, the circuit boards produced by the method of the invention can be applied not only to one-sided boards on which are formed high-density circuits with narrow conductor spacings and widths, but also to double-sided boards, multilayer boards, etc., which have through holes. Moreover, copper circuits formed by the high-speed plating method are so high in elongation percentage and so flexible that they can be suitably used not only for rigid printed wiring boards but also for flexible printed wiring boards.

We claim:

1. A method of producing conductor circuit boards comprising steps of:
   forming a thin metal layer with a thickness of 1 to 5 $\mu$m on a planar, electrically conductive substrate with a surface roughness of 0.08 to 0.23 $\mu$m, for use as a cathode, by spacing said cathode and a planar anode at an interelectrode distance of 3 to 30 mm from each other, and compulsorily supplying an electrolytic solution to said electrodes so that said electrolytic solution comes into contact with said electrodes at a solution contact speed of 2.6 to 20.0 m/sec, thereby electroplating said electrodes under the condition of a current density of 0.15 to 4.0 $A/cm^2$;
   forming a resist mask on the whole surface of said formed thin metal layer except that portion thereof which is to be formed with a conductor circuit;
   forming said conductor circuit by electroplating the surface of said thin metal layer, with said resist mask thereon, under the same conditions as said electroplating conditions, using said electrolytic solution containing copper ions;
   roughening the surface of said formed conductor circuit;
   laminating and bonding together an insulating substrate and said conductive substrate, with thus formed conductor circuit therebetween, with use of heat and pressure;
   peeling off said conductive substrate only; and
   removing said thin metal layer by etching.

2. A method according to claim 1, wherein the surface of said conductor circuit is roughened so that a deposited film thickness of 2 to 5 $\mu$m is obtained with use of an acid electrolytic solution containing copper ions and nitrate ions, under the conditions of a current density of 0.25 to 0.85 $A/cm^2$, a solution contact speed of said acid electrolytic solution, with respect to said electrodes, ranging from 0.1 to 0.8 m/sec, and an interelectrode distance of 26 to 50 mm.

3. A method according to claim 2, wherein the surface of said conductor circuit is further subjected to a chromate treatment after said roughening treatment.

4. A method according to claim 1, wherein said cathode and said anode are both fixed, and said electrolytic solution is supplied compulsorily between said electrodes.

5. A method according to claim 1, wherein said cathode is rotated so that said solution contact speed of said electrolytic solution is obtained.

6. A method according to claim 1, wherein said conductor circuit is coated with an overlay for lamination after said thin metal layer is removed by etching.

7. A method according to any one of claims 1 to 6, wherein said resist mask is removed before said insulating substrate is bonded with use of heat and pressure, so that said conductor circuit, said thin metal layer, and said conductive substrate are bonded together to said insulating substrate with use of heat and pressure.

8. A method according to any one of claims 1 to 6, wherein said conductor circuit, said resist mask, said thin metal layer, and said conductive substrate are bonded together to said insulating substrate with use of heat and pressure.

* * * * *